United States Patent
Chen

(10) Patent No.: US 10,959,336 B2
(45) Date of Patent: Mar. 23, 2021

(54) METHOD OF LIQUID ASSISTED BINDING

(71) Applicant: MIKRO MESA TECHNOLOGY CO., LTD., Apia (WS)

(72) Inventor: Li-Yi Chen, Tainan (TW)

(73) Assignee: MIKRO MESA TECHNOLOGY CO., LTD., Apia (WS)

(*) Notice: Subject to any disclaimer, the term of this patent is extended or adjusted under 35 U.S.C. 154(b) by 161 days.

(21) Appl. No.: 16/367,275

(22) Filed: Mar. 28, 2019

(65) Prior Publication Data
US 2020/0315028 A1 Oct. 1, 2020

(51) Int. Cl.
| H05K 3/30 | (2006.01) |
| H05K 1/11 | (2006.01) |
| H05K 1/18 | (2006.01) |
| H05K 1/09 | (2006.01) |
| H01L 23/00 | (2006.01) |
| H01L 21/48 | (2006.01) |

(52) U.S. Cl.
CPC .......... H05K 3/305 (2013.01); H05K 1/09 (2013.01); H05K 1/111 (2013.01); H05K 1/181 (2013.01); H01L 21/4846 (2013.01); H01L 24/83 (2013.01); H01L 2224/83895 (2013.01); H01L 2224/83948 (2013.01); H01L 2924/0105 (2013.01); H01L 2924/01022 (2013.01); H01L 2924/01029 (2013.01); H01L 2924/01049 (2013.01)

(58) Field of Classification Search
CPC .......... H05K 1/181; H05K 1/09; H05K 3/305; H05K 1/111; H01L 24/83; H01L 21/4846; H01L 2224/83895; H01L 2924/01049; H01L 2924/0105; H01L 2224/83948; H01L 2924/01029; H01L 2924/01022
See application file for complete search history.

(56) References Cited

U.S. PATENT DOCUMENTS

| 2005/0194605 A1* | 9/2005 | Shelton | H01L 33/62 257/99 |
| 2005/0258438 A1* | 11/2005 | Arik | F21V 29/51 257/88 |
| 2012/0153317 A1* | 6/2012 | Emerson | G02F 1/133603 257/89 |
| 2015/0179605 A1* | 6/2015 | Dubey | H01L 24/33 257/777 |
| 2017/0221856 A1* | 8/2017 | Yamauchi | H01L 21/187 |

FOREIGN PATENT DOCUMENTS

TW 1279391 B 4/2007

* cited by examiner

*Primary Examiner* — Vishal I Patel
(74) *Attorney, Agent, or Firm* — CKC & Partners Co., LLC

(57) ABSTRACT

A method of liquid assisted binding is provided. The method includes: forming a conductive pad on the substrate; placing a micro device on the conductive pad, such that the micro device is in contact with the conductive pad in which the micro device comprises an electrode facing the conductive pad; forming a liquid layer on the micro device and the substrate after said placing, such that a part of the liquid layer penetrates between the micro device and the conductive pad, and the micro device is gripped by a capillary force produced by said part of the liquid layer; and evaporating the liquid layer such that the electrode is bound to the conductive pad and is in electrical connection with the conductive pad.

20 Claims, 14 Drawing Sheets

METHOD OF LIQUID ASSISTED BINDING

BACKGROUND

Field of Invention

The present disclosure relates to a method of binding a micro device to a substrate.

Description of Related Art

The statements in this section merely provide background information related to the present disclosure and do not necessarily constitute prior art.

In recent years, micro devices have become popular in various applications. Among all technical aspects of micro devices, transfer process is one of the most challenging tasks for micro devices to be commercialized. One of the important issues of the transfer process is bonding the micro devices to a substrate.

SUMMARY

According to some embodiments of the present disclosure, a method of liquid assisted binding is provided. The method includes: forming a conductive pad on the substrate; placing a micro device on the conductive pad, such that the micro device is in contact with the conductive pad in which the micro device includes an electrode facing the conductive pad; forming a liquid layer on the micro device and the substrate after said placing, such that a part of the liquid layer penetrates between the micro device and the conductive pad, and the micro device is gripped by a capillary force produced by said part of the liquid layer; and evaporating the liquid layer such that the electrode is bound to the conductive pad and is in electrical connection with the conductive pad.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1:
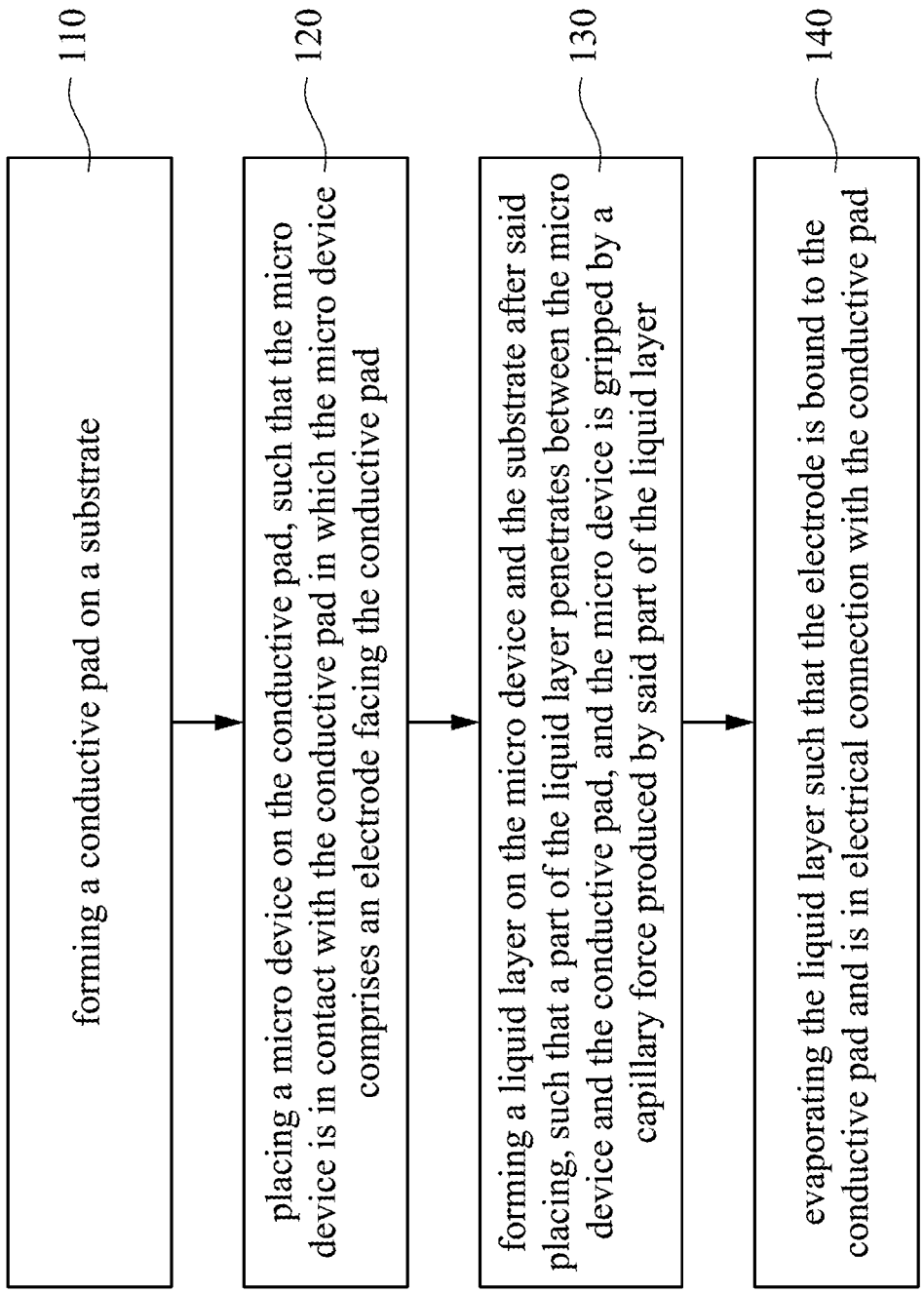
FIG. 1 is a schematic flow chart of a method of a liquid assisted binding according to some embodiments of the present disclosure.

Reference will now be made in detail to the present embodiments of the disclosure, examples of which are illustrated in the accompanying drawings.

Wherever possible, the same reference numbers are used in the drawings and the description to refer to the same or like parts.

In various embodiments, description is made with reference to figures. However, certain embodiments may be practiced without one or more of these specific details, or in combination with other known methods and configurations. In the following description, numerous specific details are set forth, such as specific configurations, dimensions, and processes, etc., in order to provide a thorough understanding of the present disclosure. In other instances, well-known semiconductor processes and manufacturing techniques have not been described in particular detail in order to not unnecessarily obscure the present disclosure. Reference throughout this specification to "one embodiment," "an embodiment", "some embodiments" or the like means that a particular feature, structure, configuration, or characteristic described in connection with the embodiment is included in at least one embodiment of the disclosure. Thus, the appearances of the phrase "in one embodiment," "in an embodiment", "in some embodiments" or the like in various places throughout this specification are not necessarily referring to the same embodiment of the disclosure. Furthermore, the particular features, structures, configurations, or characteristics may be combined in any suitable manner in one or more embodiments.

The terms "over," "to," "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers.

Reference is made to FIG. 1 and FIGS. 2A to 2E. FIG. 1 is a schematic flow chart of a method 100 of a liquid assisted binding according to some embodiments of the present disclosure. FIGS. 2A to 2E are schematic cross-sectional views of intermediate stages of the method 100 according to some embodiments of the present disclosure. In some embodiments, the method 100 of liquid assisted binding is provided. The method 100 begins with an operation 110 in which a conductive pad 220 is formed on the substrate 210 (also referred to FIG. 2A). The method 100 continues with an operation 120 in which a micro device 240 is placed on the conductive pad 220 (also referred to FIG. 2B). The method 100 continues with an operation 130 in which a liquid layer 230 is formed on the micro device 240 and the substrate 210 after said placing (also referred to FIGS. 2C and 2D). The method 100 continues with an operation 140 in which the liquid layer 230 is evaporated (also referred to FIG. 2E).

Figure 2A:
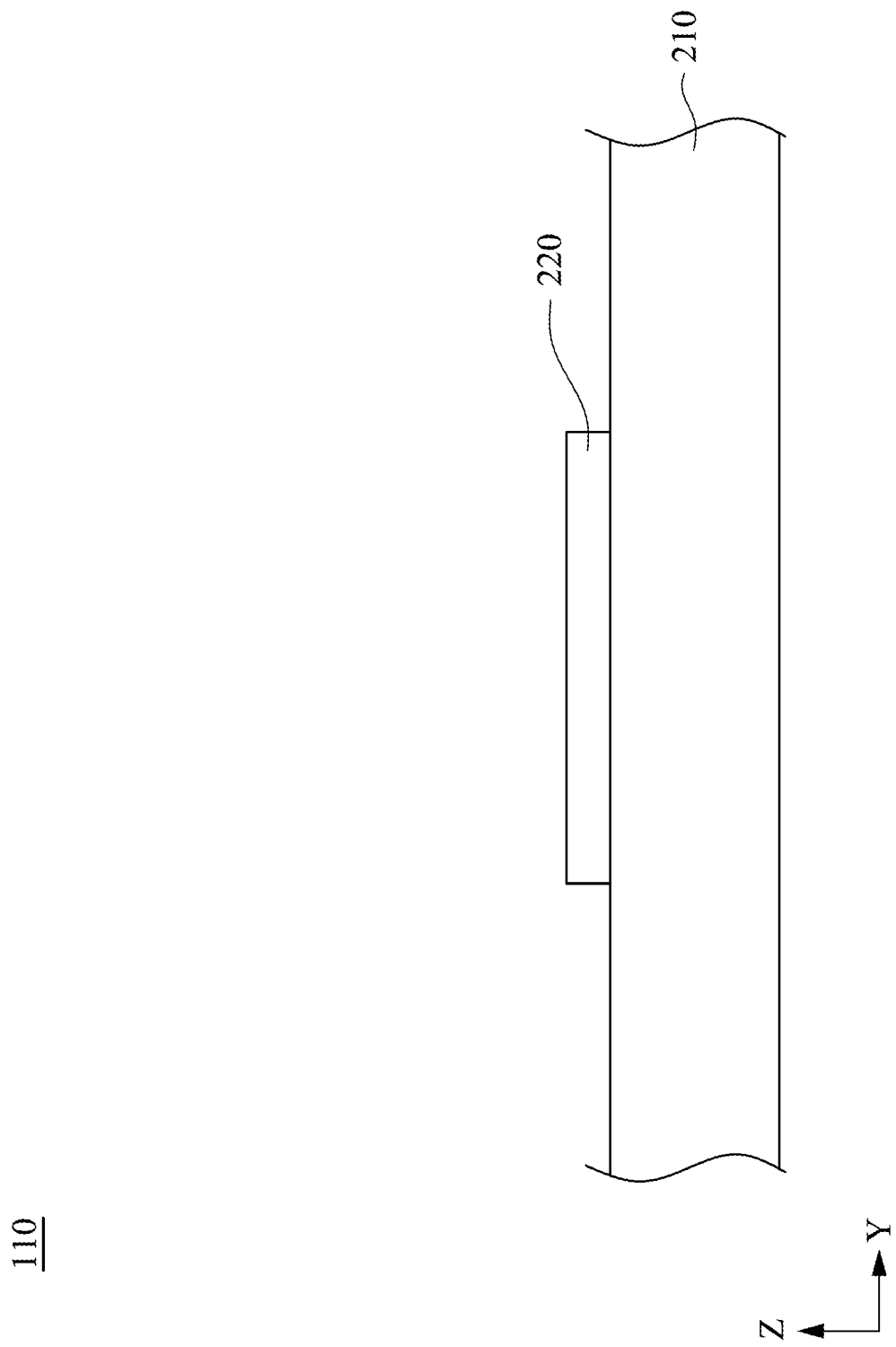
FIG. 2A is a schematic cross-sectional view of an intermediate stage of the method according to some embodiments of the present disclosure.
Figure 2B:
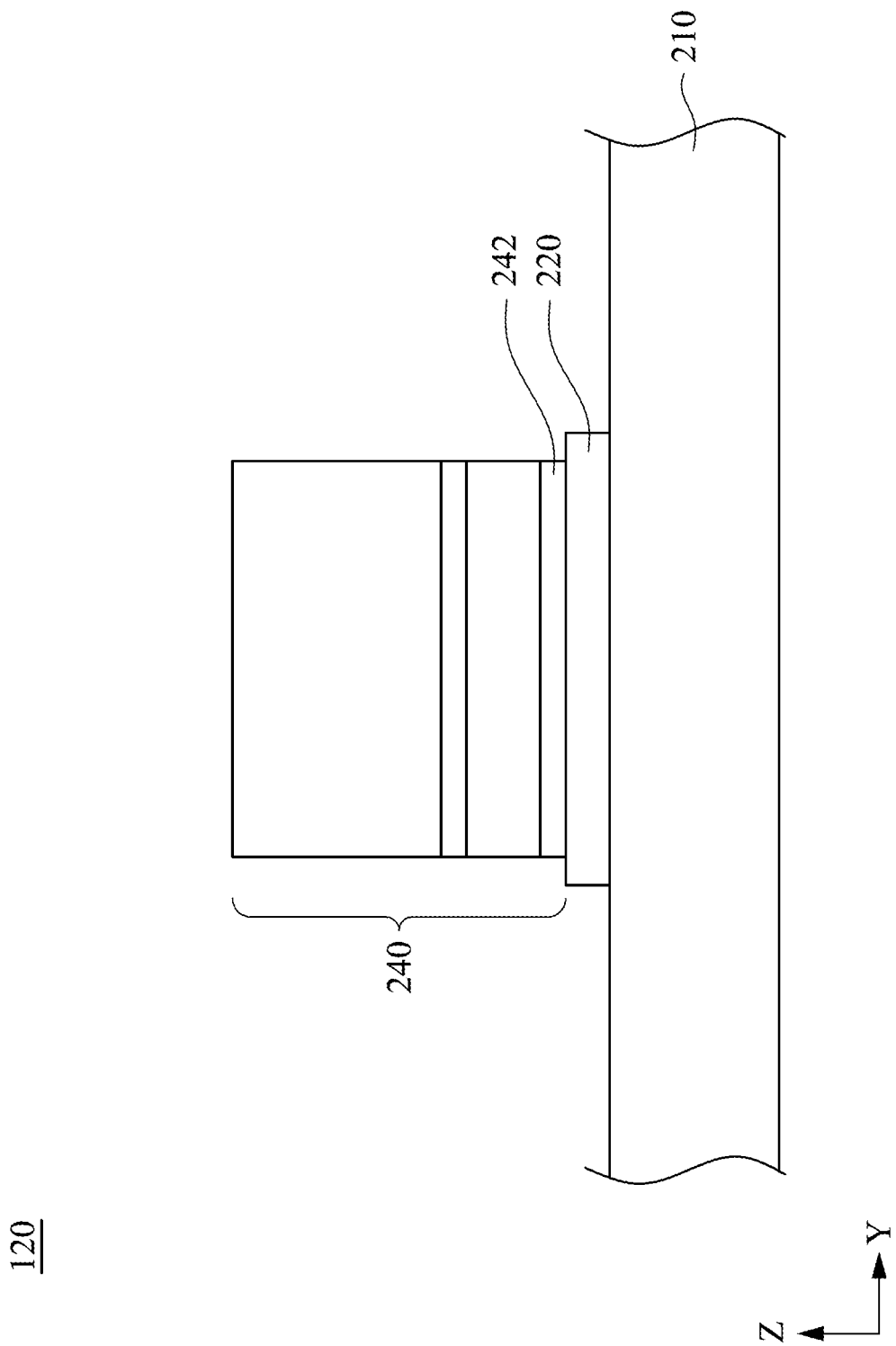
FIG. 2B is a schematic cross-sectional view of an intermediate stage of the method according to some embodiments of the present disclosure.

Reference is made to FIGS. 2A and 2B. In some embodiments, the conductive pad 220 is formed on the substrate 210 and the micro device 240 is placed on the conductive pad 220, such that the micro device 240 is in contact with the conductive pad 220. In some embodiments, the micro device includes an electrode 242 which faces the conductive pad 220. In some embodiments, at least one of the electrode 242 and the conductive pad 220 includes at least one of copper (Cu), titanium (Ti), tin (Sn), and indium (In). In some embodiments, said one of Cu, Ti, Sn, and In is consisted of more than half of the number of atoms in said at least one of the electrode 242 and the conductive pad 220. In some embodiments, a lateral length of the micro device 240 is less than or equal to about 100 μm. Said lateral length is measured in a direction Y. The direction Y is perpendicular to a thickness direction Z, and the thickness direction Z is perpendicular to a planar extension direction of the substrate 210.

Figure 2C:
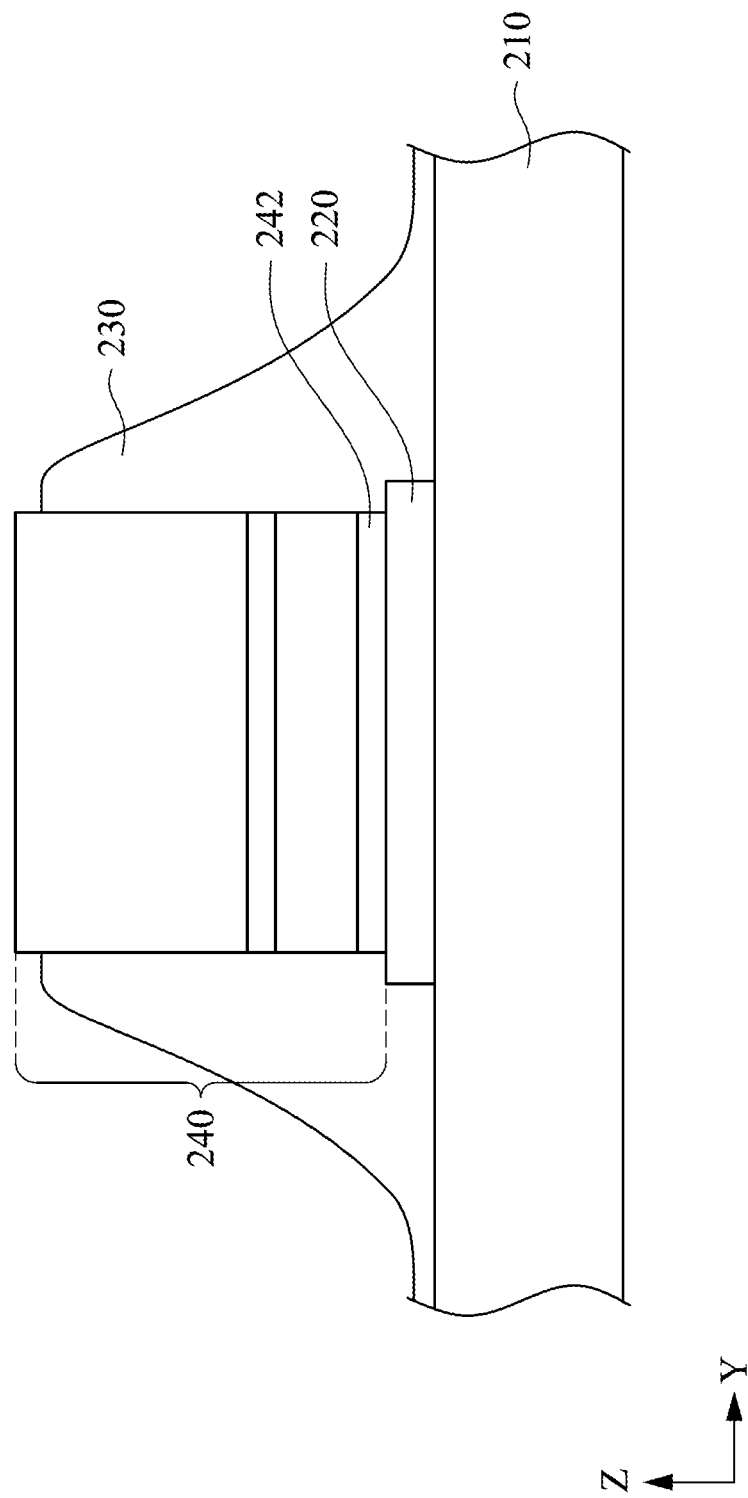
FIG. 2C is a schematic cross-sectional view of an intermediate stage of the method according to some embodiments of the present disclosure.
Figure 2D:
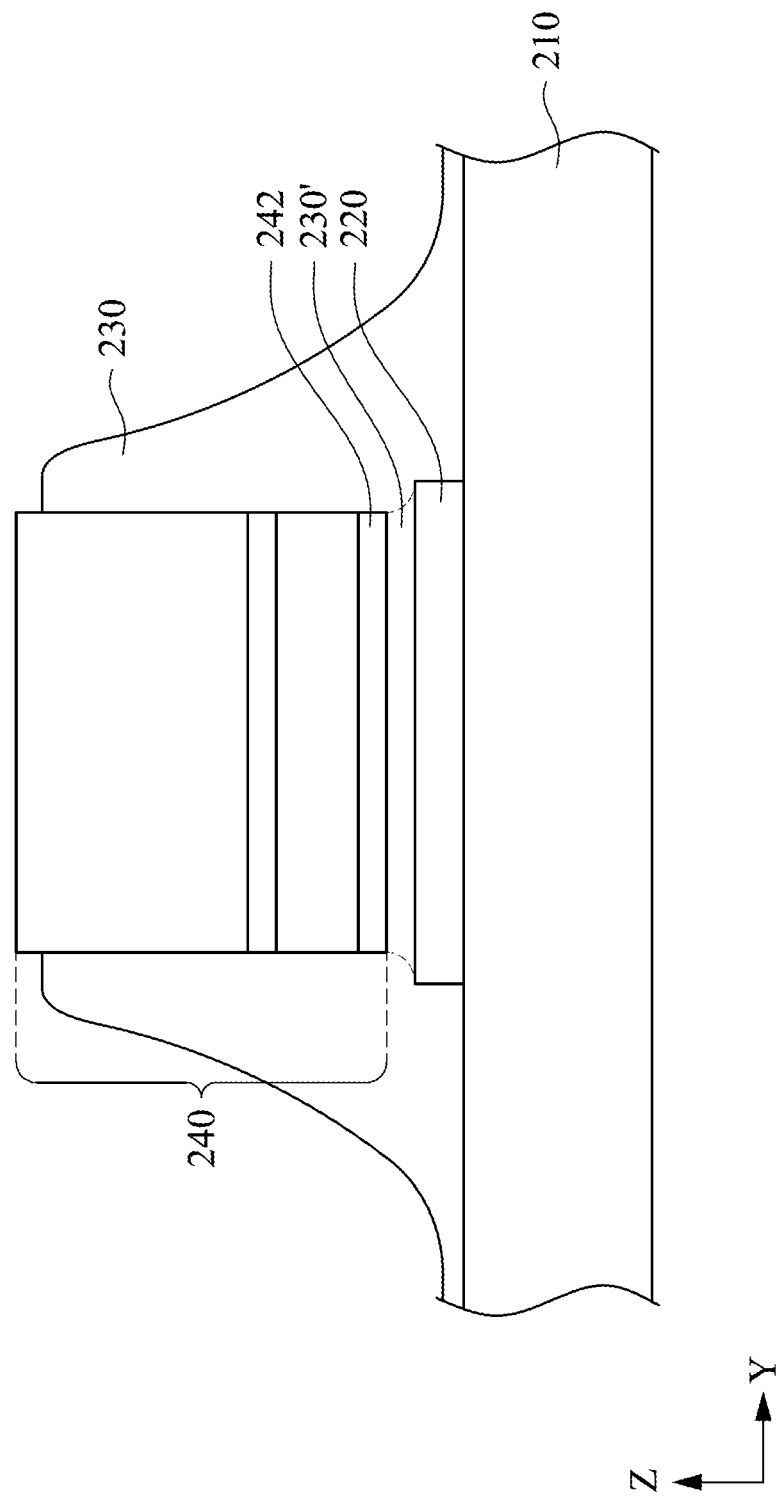
FIG. 2D is a schematic cross-sectional view of an intermediate stage of the method according to some embodiments of the present disclosure.
Figure 3:
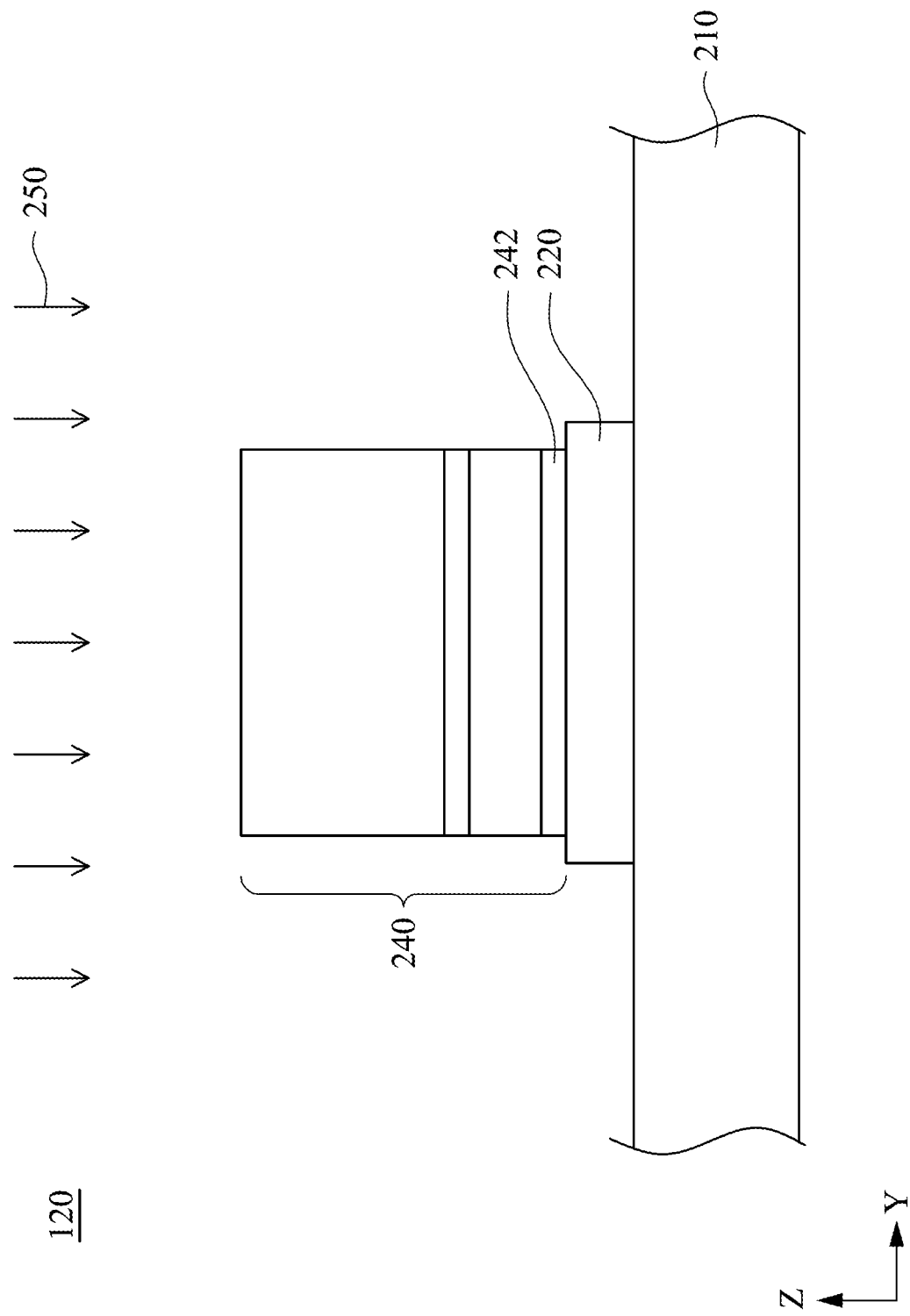
FIG. 3 is a schematic cross-sectional view of an alternative intermediate stage of the method according to some embodiments of the present disclosure.

Reference is made to FIGS. 2C and 2D in which the liquid layer 230 is formed on the micro device 240 and the substrate 210, and further made to FIG. 3. In some embodiments, the liquid layer 230 is formed on the micro device 240 and the substrate 210 (as referred to FIG. 2C) such that a part 230' of the liquid layer 230 penetrates between the micro device 240 and the conductive pad 220, and the micro device 240 is gripped by a capillary force produced by said part 230' of the liquid layer 230 (as referred to FIG. 2D). The formation of the liquid layer 230 can be achieved by lowering a temperature of the substrate 210 in an environment including a vapor, such that at least a portion of the vapor is condensed to form the liquid layer 230 on the micro device 240 and/or the substrate 210. In some embodiments, the temperature of the substrate 210 is lowered to about the water dew point to form the liquid layer 230. In some embodiments, the liquid layer 230 includes water. In some embodiments, a thickness of said part 230' of the liquid layer 230 between the micro device 240 and the conductive pad 220 is smaller than a thickness of the micro device 240 when the micro device is gripped by the capillary force.

The liquid layer 230 can be formed by different methods. FIG. 3 is a schematic cross-sectional view of an alternative intermediate stage of the method 100 according to some embodiments of the present disclosure. In some embodiments as shown in FIG. 3, a gas 250 is locally showered on the substrate 210 such that a part of the gas 250 is condensed to form the liquid layer 230 on the substrate 210 and surrounding the micro device 240. In some embodiments, the gas 250 has a water vapor pressure higher than an ambient water vapor pressure, so as to spontaneously form the liquid layer 230 after showering. In some embodiments, the gas 250 consists essentially of water and nitrogen, but should not completely exclude other compounds or elements. The gas 250 can also form the liquid layer 230 after adjusting the temperature of the substrate 210 to the dew point when the water vapor pressure of the gas 250 initially showered is lower than the ambient water vapor pressure.

Figure 2E:
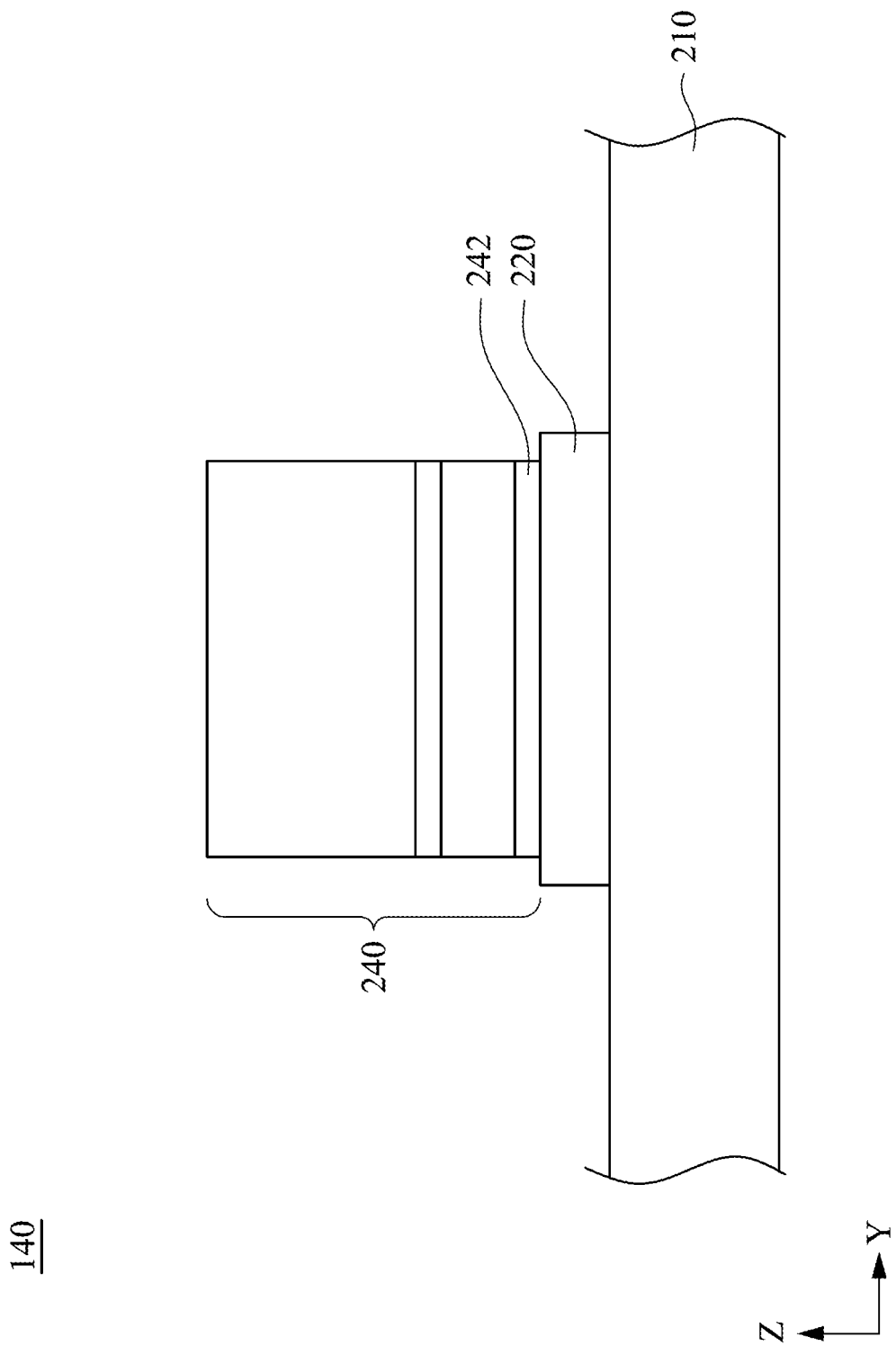
FIG. 2E is a schematic cross-sectional view of an intermediate stage of the method according to some embodiments of the present disclosure.

Reference is made to FIG. 2E, in which the liquid layer 230 is evaporated. In some embodiments, the liquid layer 230 is evaporated after the micro device 240 is gripped by the capillary force, such that the electrode 242 of the micro device 240 is stuck to the conductive pad 220. In other words, the electrode 242 is bound to and is in electrical contact with the conductive pad 220.

In some other embodiments, forming the conductive pad 220 is forming at least two conductive pads 220. One micro device 240 may include at least two electrodes 242, and the at least two electrodes 242 are separated from each other and respectively bound to the at least two conductive pads 220. A structure of the embodiments will be illustrated later.

Figure 4:
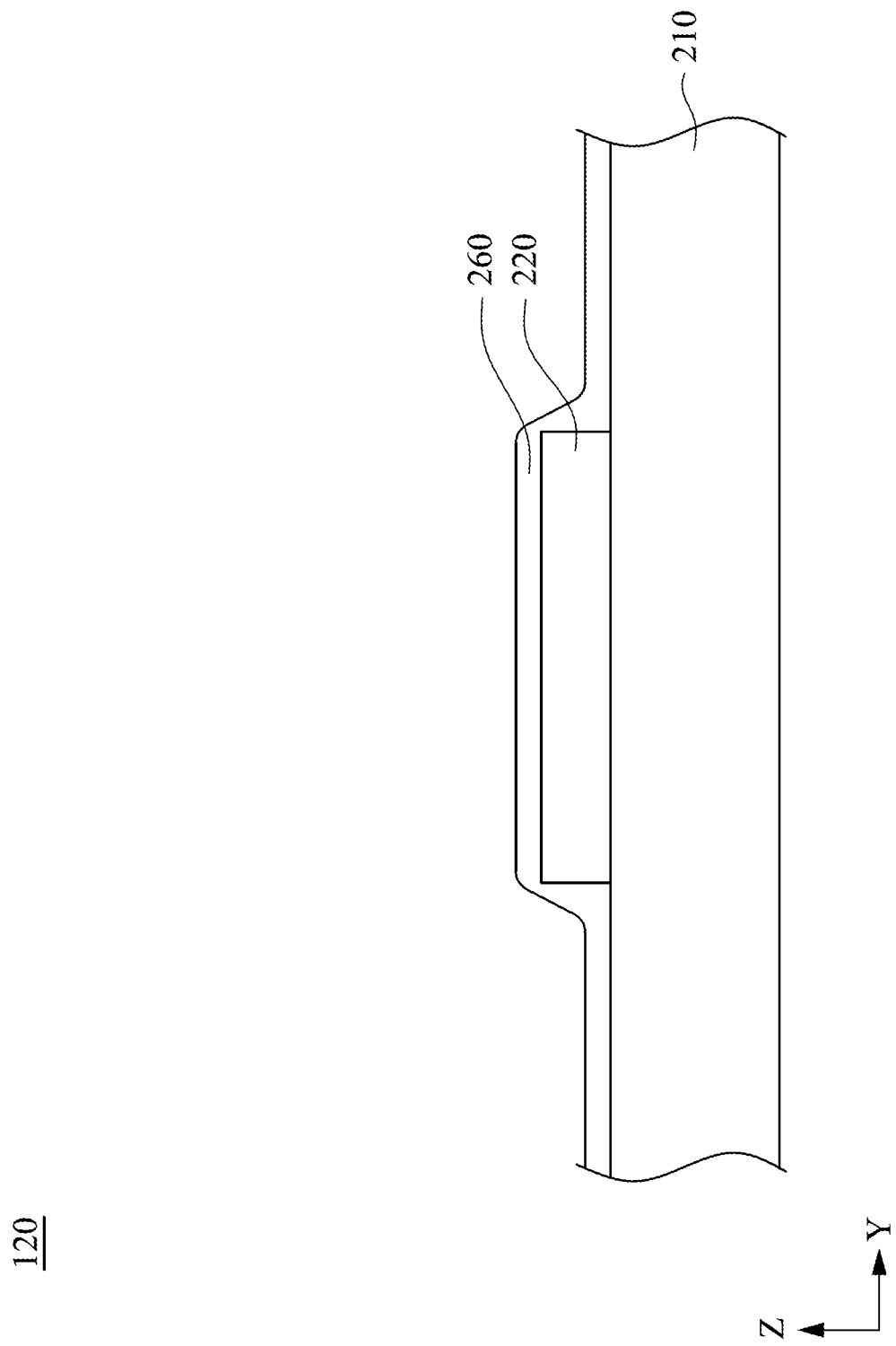
FIG. 4 is a schematic cross-sectional view of an optional intermediate stage of the method according to some embodiments of the present disclosure.

Reference is made to FIG. 4. FIG. 4 is a schematic cross-sectional view of an optional intermediate stage of the method 100 according to some embodiments of the present disclosure. In some embodiments, another liquid layer 260 is formed on the conductive pad 220 and the substrate 210 before the micro device 240 is placed on the conductive pad 220. After the formation of said another liquid layer 260, the intermediate stages of embodiments illustrated by operations 120 to 140 are then performed. By forming twice of liquid layers (i.e. the liquid layers 260, 230) in different intermediate stages and then evaporates both of the liquid layers 260, 230, the position of the micro device 240 on the conductive pad 220 can be more precise, and the binding of the micro device 240 on the conductive pad 220 can be more firm.

Figure 5:
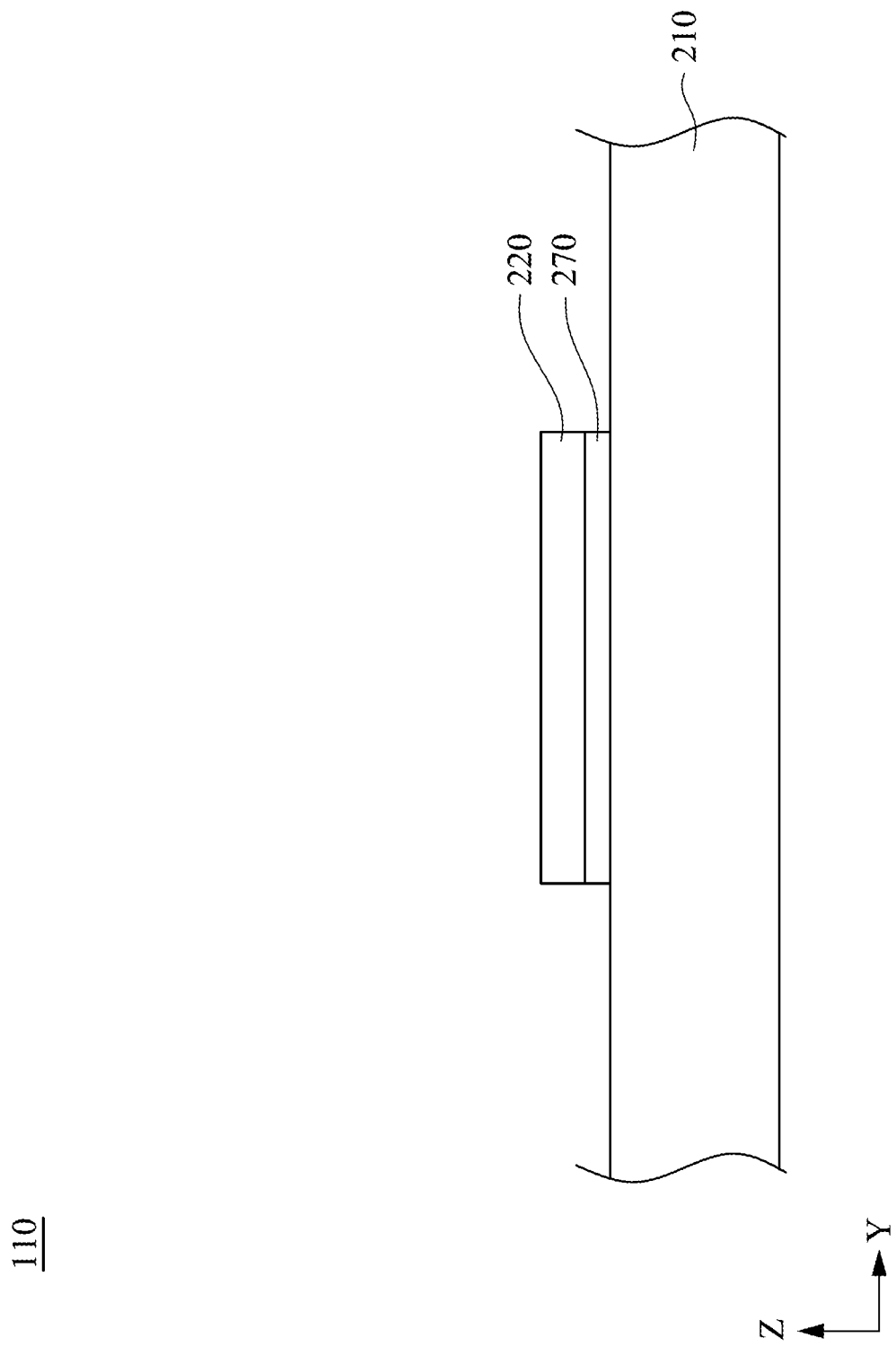
FIG. 5 is a schematic cross-sectional view of an optional intermediate stage of the method 100 according to some embodiments of the present disclosure.

Reference is made to FIG. 5. FIG. 5 is a schematic cross-sectional view of an optional intermediate stage of the method 100 according to some embodiments of the present disclosure. In some embodiments, an adhesive layer 270 is formed on the substrate 210 before the conductive pad 220 is formed, so as to enhance an adhesion of the conductive pad 220 on the substrate 210. The adhesive layer 270 can be made of chromium (Cr) or titanium (Ti), but should not be limited thereto.

Figure 6A:
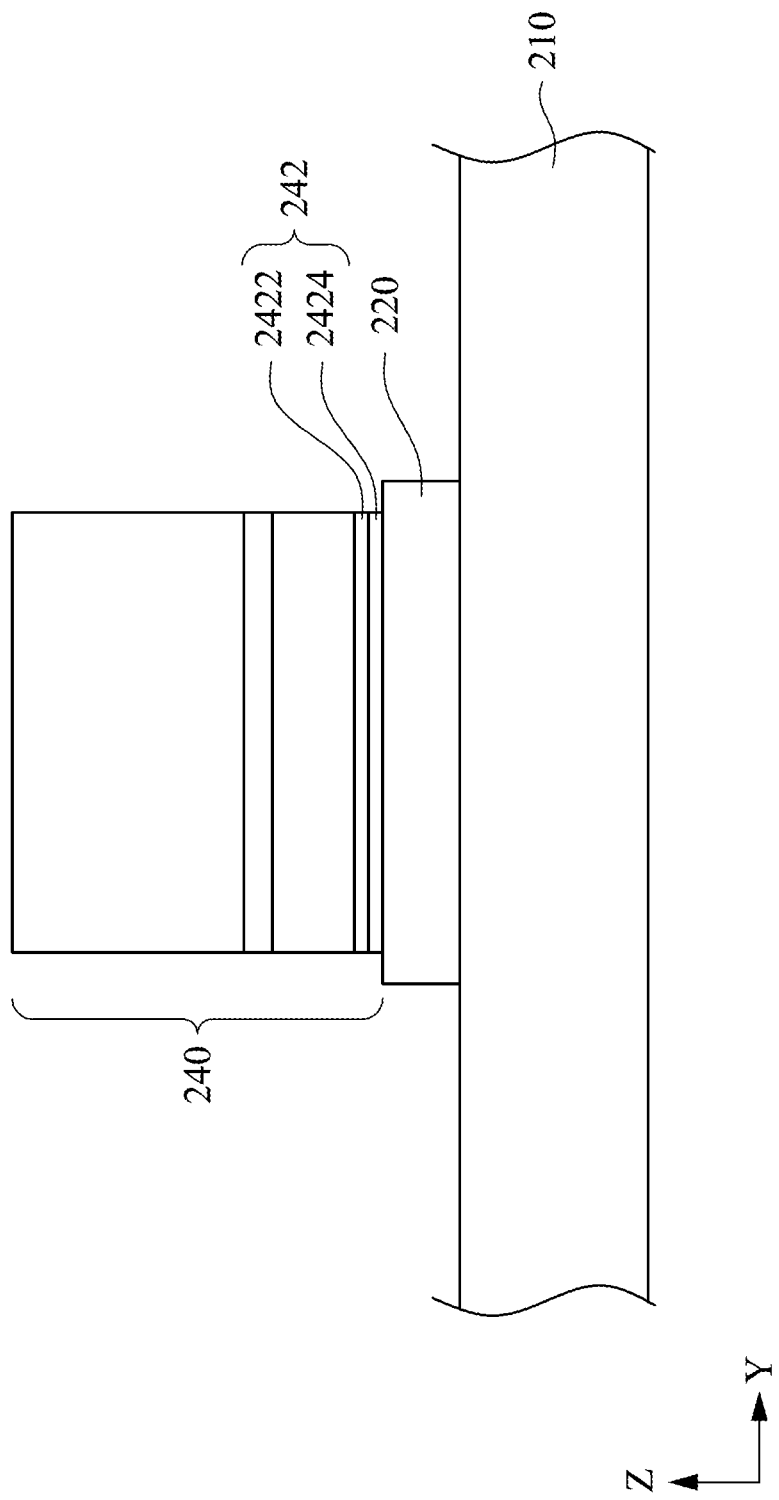
FIG. 6A is a schematic cross-sectional view of the micro device on the conductive pad according to some embodiments of the present disclosure.
Figure 6B:
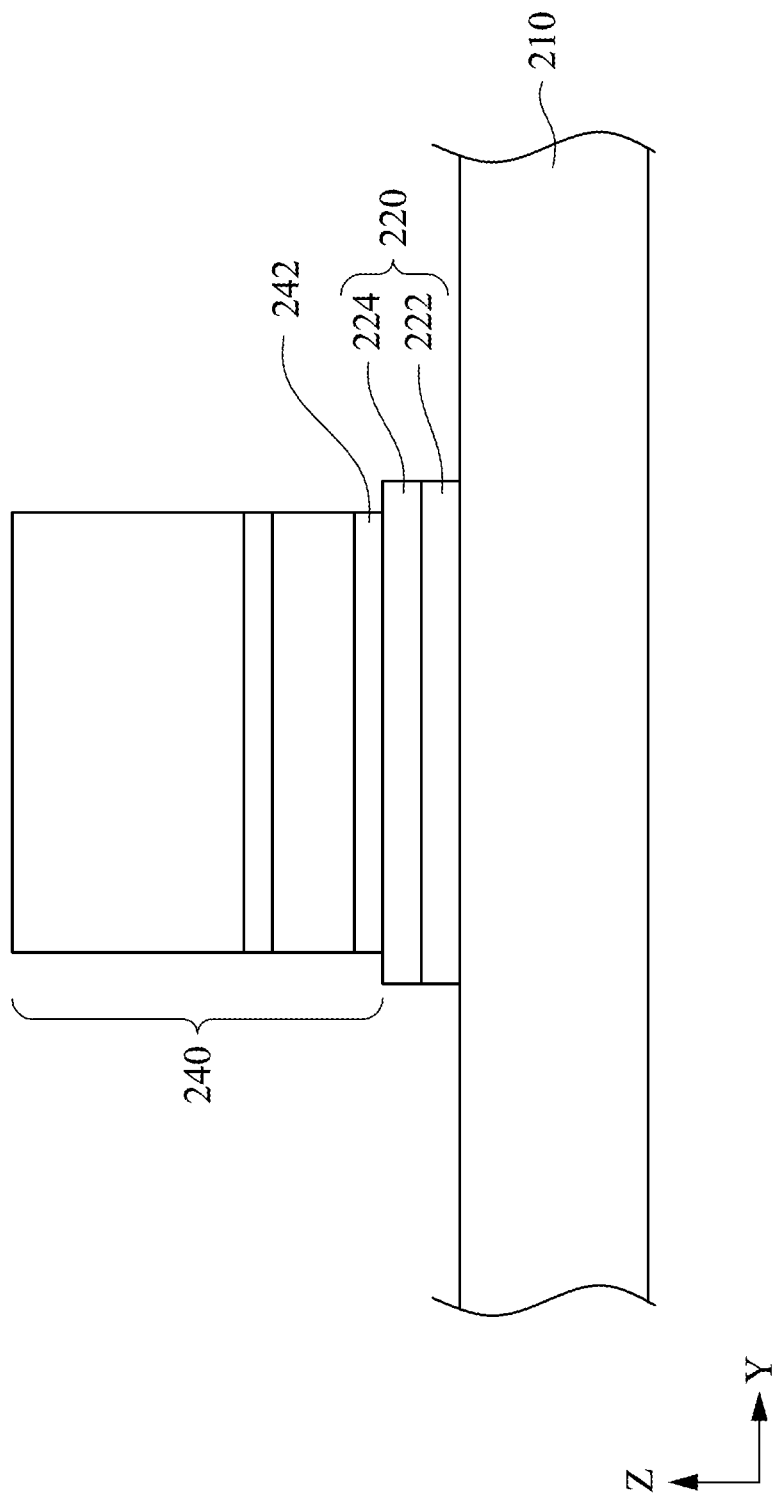
FIG. 6B is a schematic cross-sectional view of the micro device on the conductive pad according to some embodiments of the present disclosure.

Reference is made to FIGS. 6A and 6B. FIGS. 6A and 6B are schematic cross-sectional views of the micro device 240 on the conductive pad 220 according to some embodiments of the present disclosure. In some embodiments, at least one of the conductive pad 220 and the electrode 242 of the micro device 240 includes a bonding material. Specifically, in some embodiments as illustrated by FIG. 6A, the electrode 242 of the micro device 240 includes a metal electrode 2422 and a bonding material 2424 on the metal electrode 2422 and in contact with the conductive pad 220 after the electrode 242 is bound to and is in electrical contact with the conductive pad 220. In some embodiments as illustrated by FIG. 6B, the conductive pad 220 includes a metal pad 222 and a bonding material 224. The metal pad 222 is on the substrate 210, the bonding material 224 is on the metal pad 222, and the bonding material 224 is in contact with the electrode 242. The bonding materials 224, 2424 include a solder material, such as tin (Sn), indium (In), or a combination thereof, and should not be limited thereto. Note that in the present embodiments the electrode 242 is bonded to the conductive pad 220 with the temperature of the electrode 242 and the conductive pad 220 lower than the melting point of the bonding materials 2424, 224.

Figure 7:
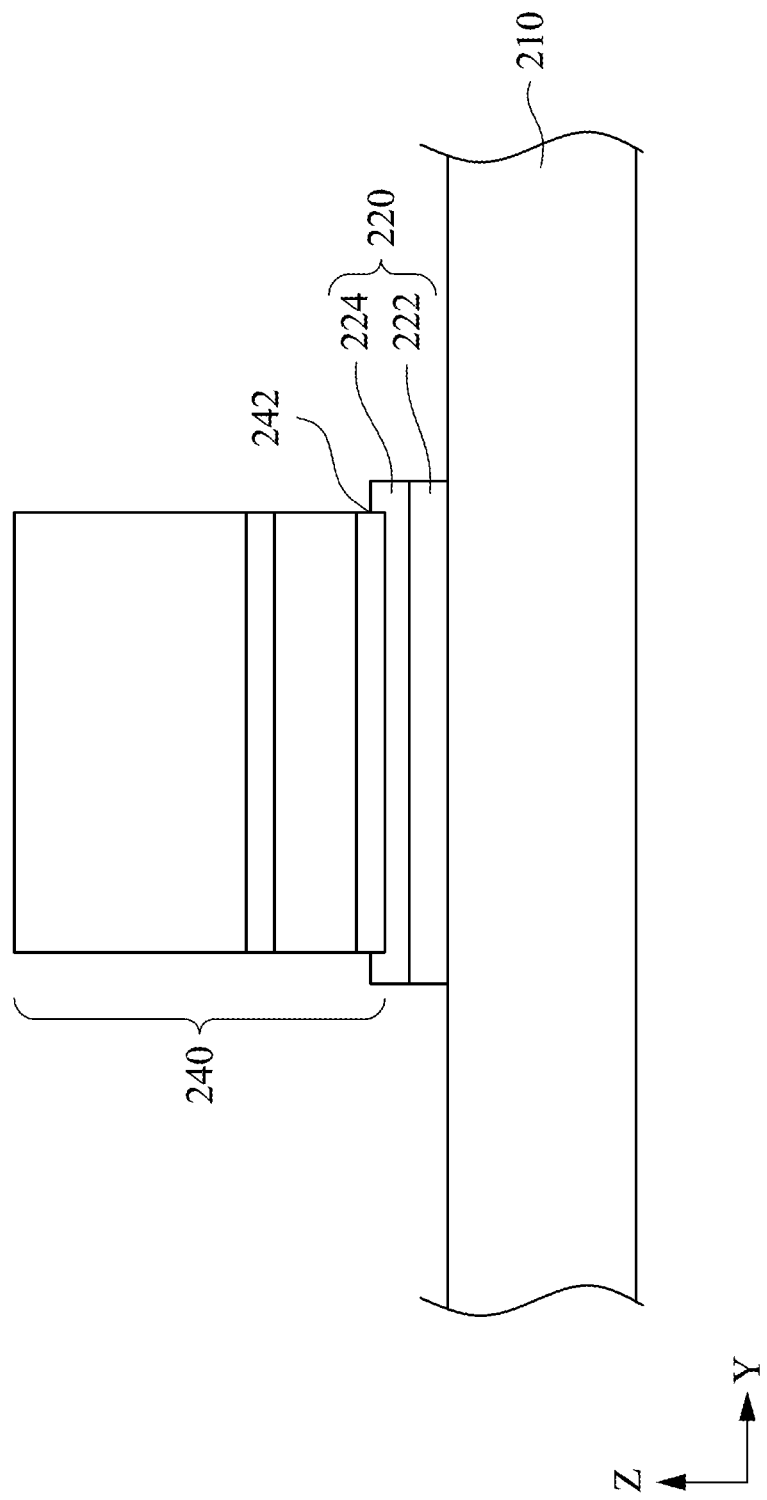
FIG. 7 is a schematic cross-sectional view of the micro device on the conductive pad according to some embodiments of the present disclosure.

Reference is made to FIG. 7. Reference is made to FIG. 7. FIG. 7 is a schematic cross-sectional view of the micro device 240 on the conductive pad 220 according to some embodiments of the present disclosure. In some embodiments, after the liquid layer 230 (or the liquid layers 230, 260) is evaporated, the temperature of the conductive pad 220 is further raised to be above a melting point of the bonding material 224 (or the bonding material 2424 in other embodiments). FIG. 7 shows a resulting structure after raising said temperature to be above said melting point. In some other embodiments, after the liquid layer 230 is evaporated, the temperature of the conductive pad 220 is further raised to be below a melting point of the bonding material 224 (or the bonding material 2424). Said "below" means a temperature point below the melting point but enough to induce an interstitial diffusion between the bonding material 224 and the electrode 242 (or between the bonding material 2424 and the conductive pad 220) such that the micro device 240 is bonded to and is in electrical contact with the conductive pad 220. In such cases, the micro device 240 can be better protected due to a lower temperature. Besides, since there is no "melting", a position precision of the micro device 240 on the conductive pad 220 is further enhanced.

In some embodiments, a thickness of the conductive pad 220 is less than or equal to about 2 µm. In some embodiments, the thickness of the conductive pad 220 is less than or equal to about 0.5 µm. In some embodiments, a thickness of the bonding material 2424 is less than or equal to about 10 µm. In some embodiments, the thickness of the bonding material 2424 is greater than or equal to about 0.1 µm. The considerations of the thicknesses of the conductive pad 220 and the bonding layer 2424 (or a thicknesses of the electrode 242 and the bonding material 224) are to ensure that enough spaces are present for the interstitial diffusion between the solder material and the noble metal (e.g., copper) or titanium. The thicknesses described herein are maximum lengths of the element (e.g., the bonding material 2424, or the conductive pad 220) parallel to the thickness direction Z in the cross-sectional views of the figures.

Figure 8:
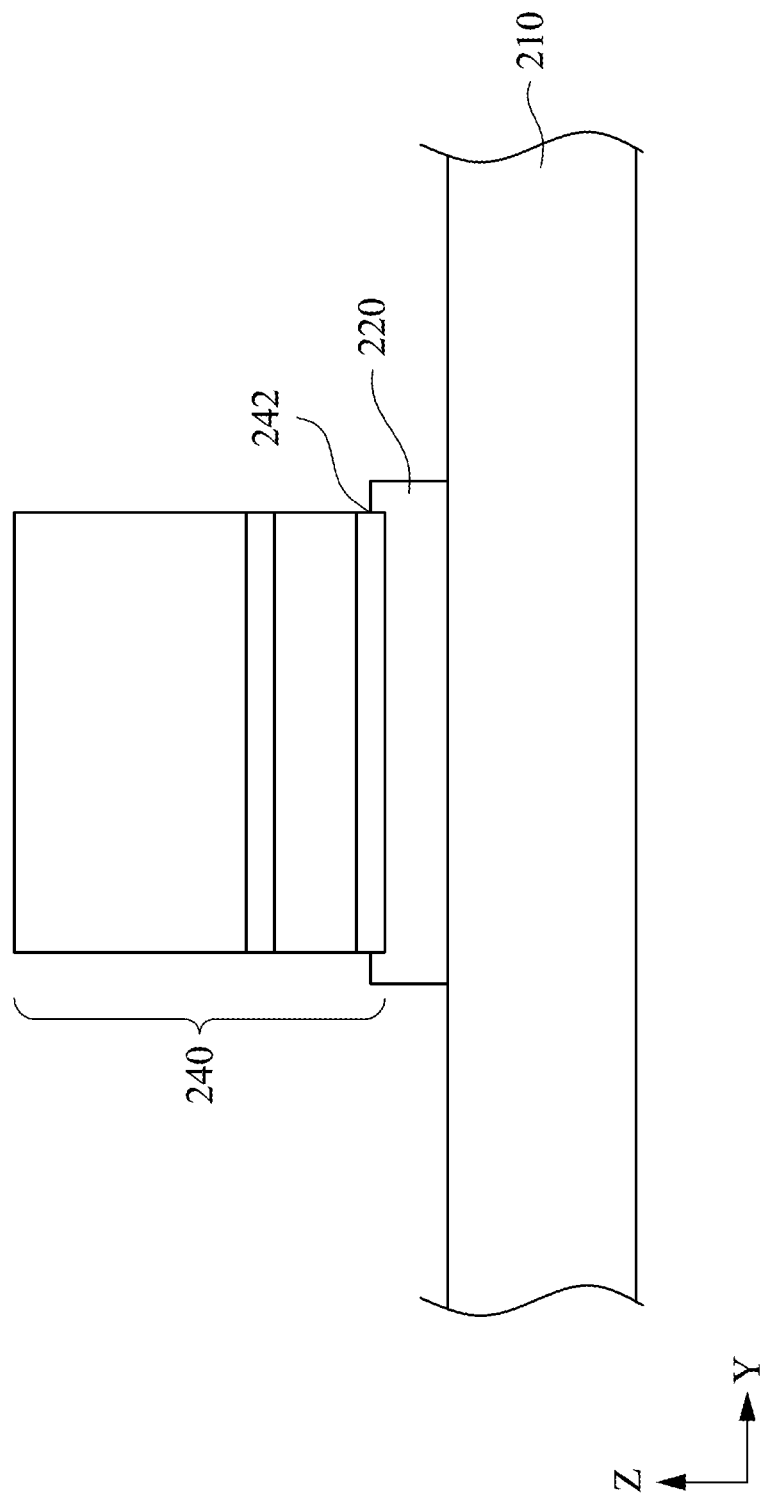
FIG. 8 is a schematic cross-sectional view of the micro device on the conductive pad according to some embodiments of the present disclosure.

Reference is made to FIG. 8. FIG. 8 is a schematic cross-sectional view of the micro device 240 on the conductive pad 220 according to some embodiments of the present disclosure. In some embodiments, after the liquid layer 230 is evaporated, the temperature of the conductive pad 220 is further raised to be above a eutectic point of the conductive pad 220 and the electrode 242 of the micro device 240. FIG. 8 shows a resulting structure after raising said temperature to be above said eutectic point.

Figure 9:
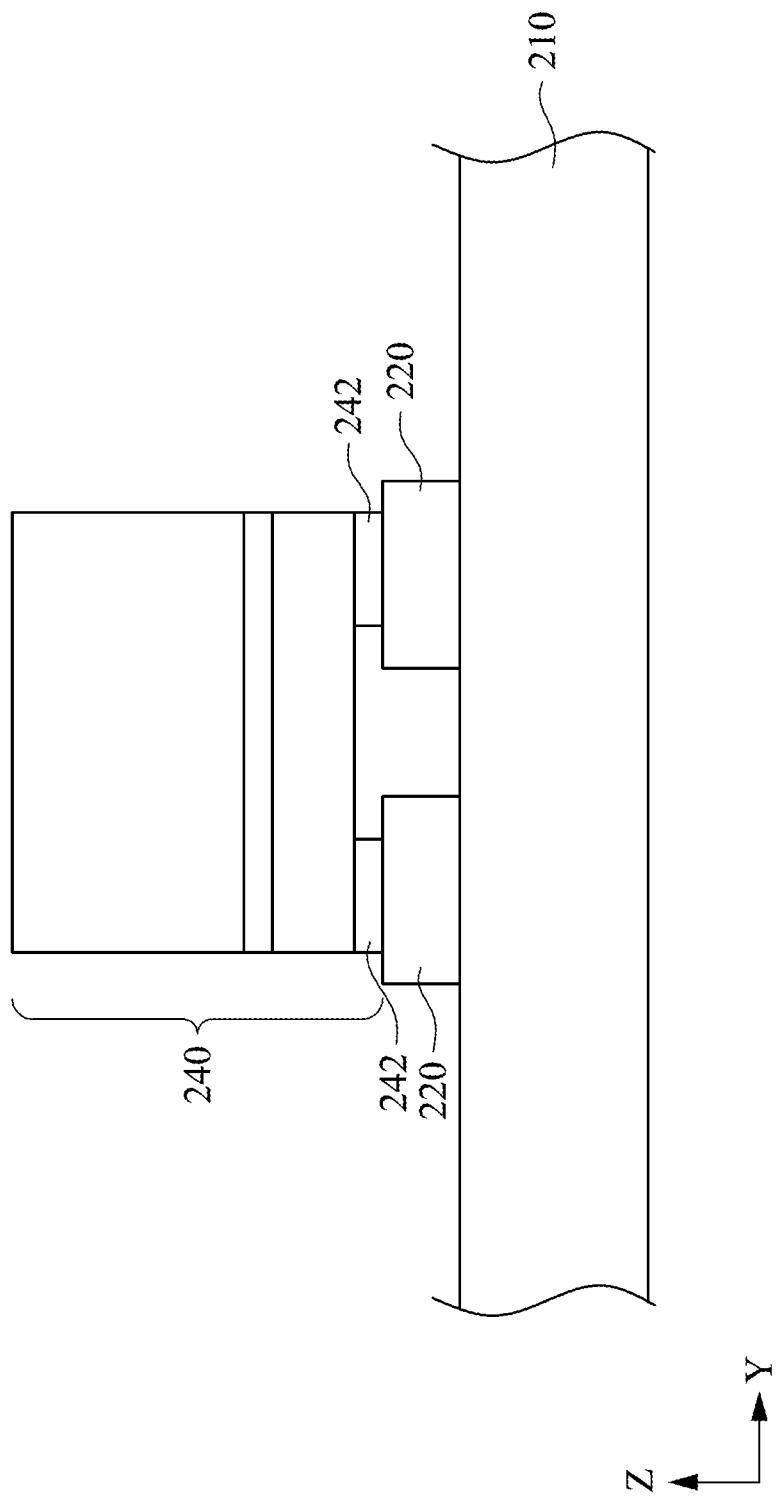
FIG. 9 is a schematic cross-sectional view of the micro device on a plurality of conductive pads according to some embodiments of the present disclosure.

Reference is made to FIG. 9. FIG. 9 is a schematic cross-sectional view of the micro device 240 on a plurality of conductive pads 220 according to some embodiments of the present disclosure. In some embodiments, there are a plurality of (e.g., two) electrodes 242 respectively in contact with a plurality of (e.g., two) conductive pads 220. It is noted that the conductive pads 220 are electrically isolated from each other. The electrodes 242, except connected to each other through other portions of the micro device 240, are also electrically isolated from each other.

In summary, a method of liquid assisted binding is provided by forming a liquid layer on a substrate after placing a micro device onto a conductive pad which has been formed on the substrate. After evaporating the liquid layer, the micro device is stuck and bound to the conductive pad. As such, the micro device is kept in place before and during the bonding process to facilitate the bonding.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A method of liquid assisted binding, comprising:
   forming a conductive pad on a substrate;
   placing a micro device on the conductive pad, such that the micro device is in contact with the conductive pad, wherein the micro device comprises an electrode facing the conductive pad;
   forming a liquid layer on the micro device and the substrate after said placing, such that a part of the liquid layer penetrates between the micro device and the conductive pad, and the micro device is gripped by a capillary force produced by said part of the liquid layer; and
   evaporating the liquid layer such that the electrode is bound to the conductive pad and is in electrical connection with the conductive pad.

2. The method of claim 1, wherein forming the liquid layer comprises:
   lowering a temperature of the substrate in an environment comprising a vapor such that at least a part of the vapor is condensed to form the liquid layer.

3. The method of claim 2, wherein the temperature of the substrate is lowered to about the water dew point to form the liquid layer.

4. The method of claim 1, wherein forming the liquid layer comprises:
   showering a gas on the micro device and the substrate such that at least a part of the gas is condensed to form the liquid layer on the micro device and the substrate.

5. The method of claim 4, wherein the gas has a water vapor pressure higher than an ambient water vapor pressure.

6. The method of claim 4, wherein the gas consists essentially of nitrogen and water.

7. The method of claim 1, further comprising:
   forming another liquid layer on the conductive pad and the substrate before placing the micro device on the conductive pad.

8. The method of claim 1, further comprising:
   forming an adhesive layer on the substrate before forming the conductive pad.

9. The method of claim 1, wherein the liquid layer comprises water.

10. The method of claim 1, wherein a thickness of the conductive pad is less than or equal to about 2 µm.

11. The method of claim 1, wherein a thickness of the conductive pad is less than or equal to about 0.5 µm.

12. The method of claim 1, wherein evaporating the liquid layer comprises:
    raising a temperature of the conductive pad such that the electrode is stuck to the conductive pad after the liquid layer is evaporated.

13. The method of claim 1, wherein at least one of the conductive pad and the electrode comprises a bonding material, and the method further comprises:
    raising a temperature of the conductive pad to be above a melting point of the bonding material after evaporating the liquid layer.

14. The method of claim 1, wherein at least one of the conductive pad and the electrode comprises a bonding material, and the method further comprises:
   raising a temperature of the conductive pad to be below a melting point of the bonding material after evaporating the liquid layer.

15. The method of claim 1, further comprising:
   raising a temperature of the conductive pad to be above a eutectic point of the conductive pad and the electrode after evaporating the liquid layer.

16. The method of claim 1, wherein a thickness of the part of the liquid layer between the micro device and the conductive pad is smaller than a thickness of the micro device when the micro device is gripped by the capillary force.

17. The method of claim 1, wherein at least one of the electrode and the conductive pad comprises one of copper, tin, titanium, and indium.

18. The method of claim 17, wherein said one of copper, tin, titanium, and indium is consisted of more than half of the number of atoms in said at least one of the electrode 242 and the conductive pad 220.

19. The method of claim 1, wherein a lateral length of the micro device is less than or equal to about 100 μm.

20. The method of claim 1, wherein a thickness of the electrode ranges from about 0.1 μm to about 10 μm.

* * * * *